(12) United States Patent
Heike

(10) Patent No.: US 8,912,789 B2
(45) Date of Patent: Dec. 16, 2014

(54) MAGNETIC FORCE MICROSCOPE AND MAGNETIC FIELD OBSERVATION METHOD USING SAME

(75) Inventor: Seiji Heike, Kawagoe (JP)

(73) Assignee: Hitachi, Ltd., Tokyo (JP)

(\*) Notice: Subject to any disclaimer, the term of this patent is extended or adjusted under 35 U.S.C. 154(b) by 261 days.

(21) Appl. No.: 13/479,860

(22) Filed: May 24, 2012

(65) Prior Publication Data

US 2012/0319679 A1    Dec. 20, 2012

(30) Foreign Application Priority Data

Jun. 16, 2011 (JP) ................................. 2011-134563

(51) Int. Cl.
*G01B 7/14* (2006.01)
*G01Q 60/56* (2010.01)
*G01R 33/038* (2006.01)
*B82Y 35/00* (2011.01)

(52) U.S. Cl.
CPC ............ *G01R 33/0385* (2013.01); *G01Q 60/56* (2013.01); *B82Y 35/00* (2013.01)
USPC ................. 324/207.11; 324/207.16; 324/244; 324/260

(58) Field of Classification Search
CPC .................................. G01B 7/14; G01R 33/02
USPC ........................ 324/207.11, 207.16, 244, 260
See application file for complete search history.

(56) References Cited

U.S. PATENT DOCUMENTS

| 7,703,314 B2* | 4/2010 | Abe et al. ........................ 73/105 |
| 2001/0038282 A1* | 11/2001 | Abe .............................. 324/210 |
| 2002/0021515 A1* | 2/2002 | Abe ................................. 360/31 |

OTHER PUBLICATIONS

Koike et al.; "Spin-Polarized Scanning Electron Microscope for Magnetic Domain Observation"; Japanese Journal of Applied Physics; Jul. 1985; pp. L542-L544; vol. 24; No. 7.
Martin et al.; "Magnetic imaging by "force microscopy" with 1000 A resolution"; Applied Physics Letters; May 1987; pp. 1455-1457; vol. 50; No. 20.

\* cited by examiner

*Primary Examiner* — Arleen M Vazquez
*Assistant Examiner* — Alesa Allgood
(74) *Attorney, Agent, or Firm* — Mattingly & Malur, PC

(57) ABSTRACT

A magnetic force microscope capable of measuring the absolute value of a magnetic field with high resolution without causing a change in magnetization state of the probe. The magnetic force microscope includes a cantilever, a probe, a displacement detector that detects a displacement of the probe, a specimen carrier, and various transfer units. The magnetic force microscope that measures an undulation distribution as well as a magnetic field distribution on the surface of a specimen placed on the specimen carrier is further provided with a magnetic-field impress-unit that impresses a magnetic field to the probe, and an output of the magnetic-field impress-unit is controlled such that a magnetic force impressed onto the probe 5 is turned zero to thereby measure a magnetic field distribution on the surface of the specimen.

5 Claims, 2 Drawing Sheets

MAGNETIC FORCE MICROSCOPE AND MAGNETIC FIELD OBSERVATION METHOD USING SAME

CLAIM OF PRIORITY

The present application claims priority from Japanese patent application JP 2011-134563 filed on Jun. 16, 2011, the content of which is hereby incorporated by reference into this application.

FIELD OF THE INVENTION

The present invention relates to a magnetic force microscope that measures a magnetic field distribution on the surface of a specimen, and a magnetic field observation method.

BACKGROUND OF THE INVENTION

Techniques according to the related art, for use in observing the surface of a magnetic material, include the Bitter technique, the Kerr microscopy, the spin-polarized scanning electron microscopy (hereinafter referred to as SPIN-SEM), the Lorentz electron microscopy, the magnetic force microscopy (MFM: Magnetic Force Microscopy), and so forth. The Bitter technique is a long-established technology whereby a colloidal solution of magnetic particulates is dropped on the surface of a magnetic specimen to thereby observe a pattern of the magnetic particulates attracted to the vicinity of a magnetic domain wall of the specimen by use of an optical microscope. The Kerr microscopy is a magneto-optic technique for observing a magnetic domain with the use of a polarization microscope by making use of the magnetic Kerr effect whereby upon linearly polarized light falling on a magnetic specimen, resultant reflected light is turned into elliptically polarized light, the technique as well having been known for a long time. The SPIN-SEM microscopy is a technique whereby a spin of a secondary electron emitted upon irradiation of a magnetic material with an electron beam is decomposed into three-dimensional spectral components to thereby detect the spin {refer, to for example, Jpn. J. Appl. Phys., by K. Koike, et al., Vol. 24, L542 (1985)}. The secondary electron emitted from the magnetic material has information on spin magnetic moment inside the specimen, and if the information can be detected to be mapped, both the magnitude, and the orientation of magnetization on the surface of the specimen can be obtained as a two-dimensional image. The Lorentz electron microscopy is a technique for visualizing a magnetic domain wall, or a magnetic domain by utilizing a bend of an electron beam, caused by a Lorentz force that the electron beam has received from inside the specimen upon the electron beam transmitting through a magnetic material.

On the other hand, the magnetic force microscopy (MFM) is based on a technique called the atomic force microscopy (AFM: Atomic Force Microscopy) without use of light and an electron beam. This technique is a technique for mapping a magnetic force distribution by scanning the surface of a specimen with a probe while detecting a magnetic force acting between a cantilever having the probe with a magnetic matter coated thereon and a magnetic specimen, as deflection of the cantilever {refer to, for example, Appl. Phys. Lett., by Y. Martin et al., Vol. 50, 1455 (1987)}. As an atomic force besides a magnetic force and so forth are acting on the probe, it is necessary to separate the magnetic force from other interaction. Accordingly, the cantilever is first vibrated, and a distance between the probe and the specimen is adjusted such that a decrease in vibration amplitude, due to the atomic force acting at the time of contact between the probe and the specimen, is held constant. By so doing, a position of the surface of the specimen, in the direction of height, is decided upon, and with the probe kept in its state away from the surface of the specimen by a given distance from the position, the magnetic force acting at a long distance is detected from a phase change in vibration of the cantilever.

SUMMARY OF THE INVENTION

The Bitter technique, and the Kerr microscopy each represent a relatively simple method, however, with both the methods, the optical microscope is in use, so that both the methods have resolution on the order of 1 μm, and it is therefore impossible to observe a microscopic structure of a magnetic domain. The SPIN-SEM microscopy has high resolution on the order of several nm; however, because of high surface sensitivity, there is the need for not only exposing an observation target by applying a surface treatment to a specimen, but also operating in a super-high vacuum. Further, with the Lorentz electron microscopy, since it is necessary to work on the specimen so as to be small in thickness to enable electrons to transmit therethrough, there will arise a concern about a change in quality of the specimen, caused by working thereon.

On the other hand, with the magnetic force microscopy (MFM), an operation is possible in the atmosphere, and a high resolution on the order of 10 nm can be obtained by a relatively simple manipulation of a magnetic force microscope. With the magnetic force microscopy (MFM), however, information on magnetism is obtained as a magnetic force acting between the tip of the probe and the surface of the specimen, and magnitude of the magnetic force which the probe receives from a specimen magnetic field is dependent on magnitude of a magnetic moment, so that it is difficult to measure the absolute value of a magnetic field strength on the surface of the specimen.

Furthermore, there exists a problem in that if a magnetic field from the specimen is greater than a coercive force of the probe, a magnetization state at the tip of the probe undergoes a change, so that a magnetic force distribution accurately reflecting a specimen magnetic field cannot be obtained.

It is therefore an object of the present invention to provide a magnetic force microscope capable of measuring the absolute value of a magnetic field strength with high resolution without causing a change in magnetization state at the tip of the probe.

In order to achieve the object, the present invention provides in its one aspect a magnetic force microscope including a unit that measures an undulation distribution as well as a magnetic field distribution, on the surface of a magnetic specimen.

The magnetic force microscope includes a cantilever, a probe provided at the tip of the cantilever, at least part of the probe being provided with a magnetized material, a displacement detector that detects a displacement of the cantilever, a magnetic-field impress-unit that impresses a magnetic field onto the probe, a magnetic field control unit that controls a magnetic field generated by the magnetic-field impress-unit such that a magnetic force impressed onto the probe by the magnetic-field impress-unit is turned zero, and a distance-hold unit that holds a distance to such an extent as the probe does not come into contact with the specimen while controlling the displacement of the cantilever on the basis of a signal sent out from the displacement detector, in which a magnetic field distribution on the surface of the specimen is acquired while holding the distance to such an extent as the probe does not come into contact with the specimen in a state where the magnetic force impressed onto the probe is turned zero.

In order to achieve another object of the present invention, the present invention provides in its another aspect a magnetic field observation method using a magnetic force microscope provided with a unit that measures an undulation distribution as well as a magnetic field distribution on the surface of a magnetic specimen, the magnetic force microscope further including a cantilever, a probe provided at the tip of the cantilever, at least part of the probe being provided with a magnetized material, a displacement detector that detects a displacement of the cantilever, a magnetic-field impress-unit that impresses a magnetic field onto the probe, a specimen carrier that places the specimen thereon, and a transfer unit that transfers the specimen carrier. The magnetic field observation method includes controlling a magnetic field generated from the magnetic-field impress-unit such that a magnetic force impressed onto the probe 5 by use of the magnetic-field impress-unit is turned zero, holding a distance away from the specimen to such an extent as the probe does not come into contact with the specimen while controlling a displacement of the cantilever on the basis of a signal sent out from the displacement detector, holding the distance away from the specimen to such an extent as the probe does not come into contact with the specimen while keeping a state where the magnetic force impressed on the probe is turned zero, and acquiring the magnetic field distribution on the surface of the specimen while holding the distance away from the specimen to such an extent as the probe does not come into contact with the specimen, in a state where the magnetic force impressed on the probe is turned zero.

The present invention has been developed on the basis of a new a finding that a magnetic force to which the probe is subjected by the agency of a magnetic field from the surface of a specimen can be offset by an external magnetic field to be impressed.

Accordingly, even if the magnetic field from the specimen is greater than the coercive force of the probe, it is possible to obtain a magnetic force distribution accurately reflecting the specimen magnetic field without changing the magnetization state at the tip of the probe. Further, according to the present invention, the absolute value of the magnetic field strength on the surface of the specimen can be measured without depending on the magnitude of the magnetic force that the probe has receives from the specimen magnetic field.

Thus, there can be obtained a magnetic force microscope capable of measuring the absolute value of a magnetic field strength with high resolution.

Furthermore, according to the aspects of the present invention, a distribution of the respective absolute values of magnetic-field strengths on the surface of a specimen can be measured without changing the magnetization state of the probe.

DETAILED DESCRIPTION OF THE PREFERRED EMBODIMENTS

There is described hereinafter an embodiment of a magnetic force microscope (MFM) according to the invention.

Figure 1:
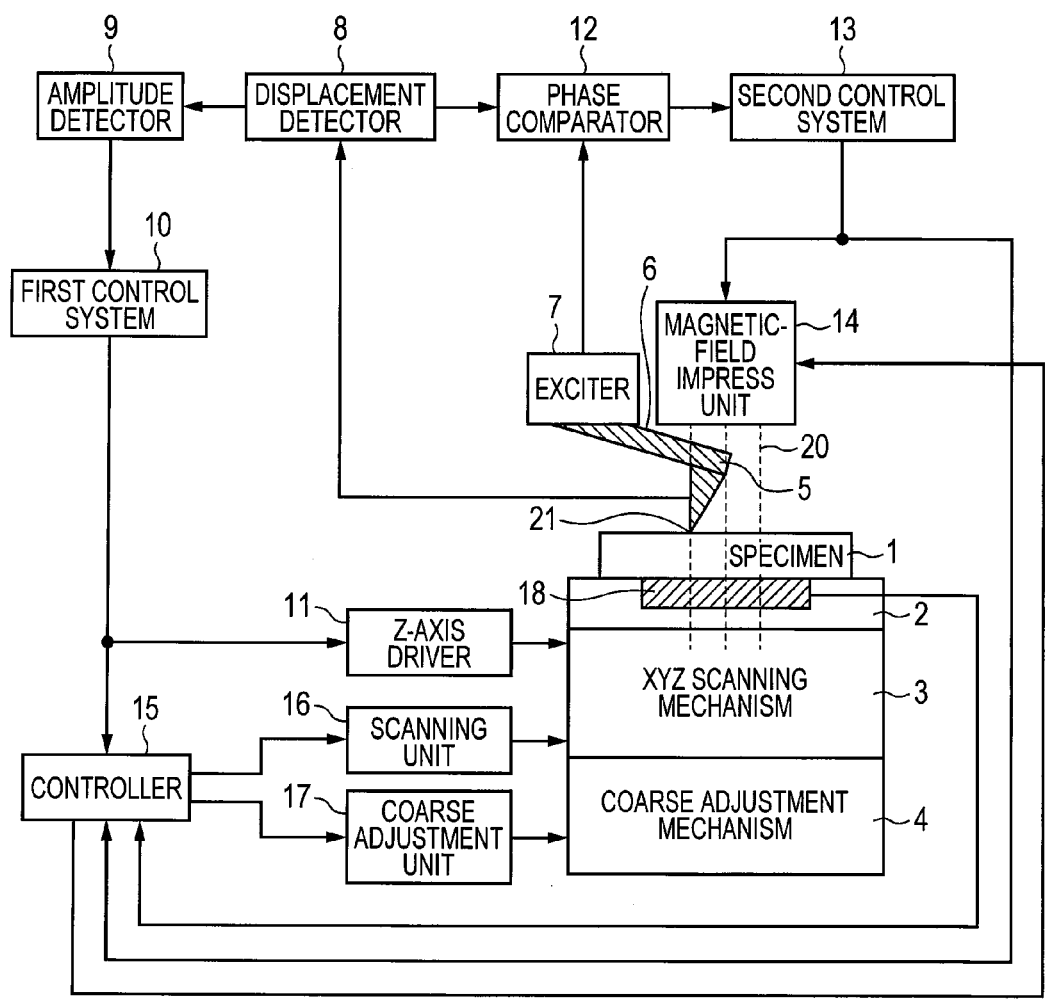
FIG. 1 is a schematic block diagram showing a magnetic force microscope (MFM) according to one embodiment of the invention.

FIG. 1 is a schematic block diagram showing a magnetic force microscope (MFM) according to one embodiment of the invention. A specimen 1 is a specimen made of a magnetic material. A cantilever 6 is disposed so as to be opposed to the surface of the specimen 1, and a probe 5 is provided at the tip of the cantilever 6. The probe 5 itself is made of a ferromagnetic material, or the probe 5 is coated with a ferromagnetic material to be magnetized in a given direction. The cantilever 6 and the probe 5 are vibrated by an exciter 7 at the eigen frequency thereof, or at a frequency (within around ±1% of the eigen frequency) in the neighborhood thereof in a direction perpendicular to the surface of the specimen 1 under measurement. The cantilever 6 undergoes a displacement due to an interaction with the specimen 1 besides forced vibration caused by an exciter 7, and the displacement is detected by a displacement detector 8. The specimen 1 is fixedly attached to an XYZ scanning mechanism 3, and a coarse adjustment mechanism 4 through the intermediary of a specimen carrier 2, and the specimen 1 can be transferred in the respective directions for 3-dimensional orientations against the probe 5 by use of the XYZ scanning mechanism 3. Further, a distance between the specimen 1 and the probe 5 can be largely varied by use of the coarse adjustment mechanism 4.

Further, a displacement signal of the cantilever 6, sent out from the displacement detector 8, is inputted to an amplitude detector 9, whereupon an amplitude signal identical in frequency component to an excitation signal of the exciter 7 is outputted. Upon the probe 5 coming into contact with the surface of the specimen 1, a vibration amplitude of the cantilever 6 decreases according to the distance between the probe 5 and the specimen 1. The XYZ scanning mechanism 3 is driven in a Z-axis direction via a Z-axis driver 11 by use of a first control system 10 such that the amplitude signal from the amplitude detector 9 will be at a given set value, and the distance between the probe 5 and the specimen 1 is always kept at a given value by adjusting a position of the specimen 1, in relation to the probe 5, in the Z-axis direction. By so doing, the distance between the probe 5 and the specimen 1 becomes always constant regardless of asperities on the surface of the specimen. That is, the distance between the probe and the surface of the specimen can be controlled by adjusting the position of the specimen, in relation to the probe, in the Z-axis direction, by use of a distance-control unit including the amplitude detector 9, and a first control system 10.

Further, the displacement signal of the cantilever 6, sent out from the displacement detector 8, is inputted to a phase comparator 12, and the phase of the excitation signal of the exciter 7 is compared with the phase of a signal identical in frequency component to the excitation signal in the displacement signal of the cantilever 6, whereupon a phase signal proportional to a phase difference is outputted. The phase signal undergoes a change according to a force applied to the probe 5, however, if the probe 5 is sufficiently kept apart from the specimen 1 by a distance to such an extent as the probe does not come into contact with the specimen (of not less than 1 nm, practically, not less than 5 nm), this will enable the effect of a force due to mechanical contact, and the effects of van der Waals' forces as well to be ignored, so that the phase signal reflects a magnetic force that the probe 5 receives from a leakage magnetic field from the specimen 1. That is, the magnetic force can be separated from other forces. Further, a magnetic-field impress-unit 14 is disposed in the vicinity of the probe 5 to thereby enable an optional magnetic field to be impressed onto the probe 5. At a time when the strength of a magnetic field from the specimen at a position of the tip of the probe 5 is identical to the strength of the magnetic field from the magnetic-field impress-unit 14, a magnetic force impressed onto the probe 5 is offset by the magnetic field from the magnetic-field impress-unit 14 to be turned zero, whereupon the phase signal will be equal to a phase signal at a time when no external force is impressed on the probe 5. Accordingly, the magnetic-field impress-unit 14 is driven by use of a second control system 13 such that the phase signal from the phase comparator 12 is at the same value as a value for a point in time, when no external force is impressed onto the probe 5, and the magnetic force impressed onto the probe 5 is kept at zero by adjusting the magnetic field to be impressed onto the probe 5. At this point in time, the strength of the magnetic field outputted from the magnetic-field impress-unit 14 is turned identical to the strength of the magnetic field outputted from the surface of the specimen 1.

<Magnetic Field Observation Method>

Figure 2:
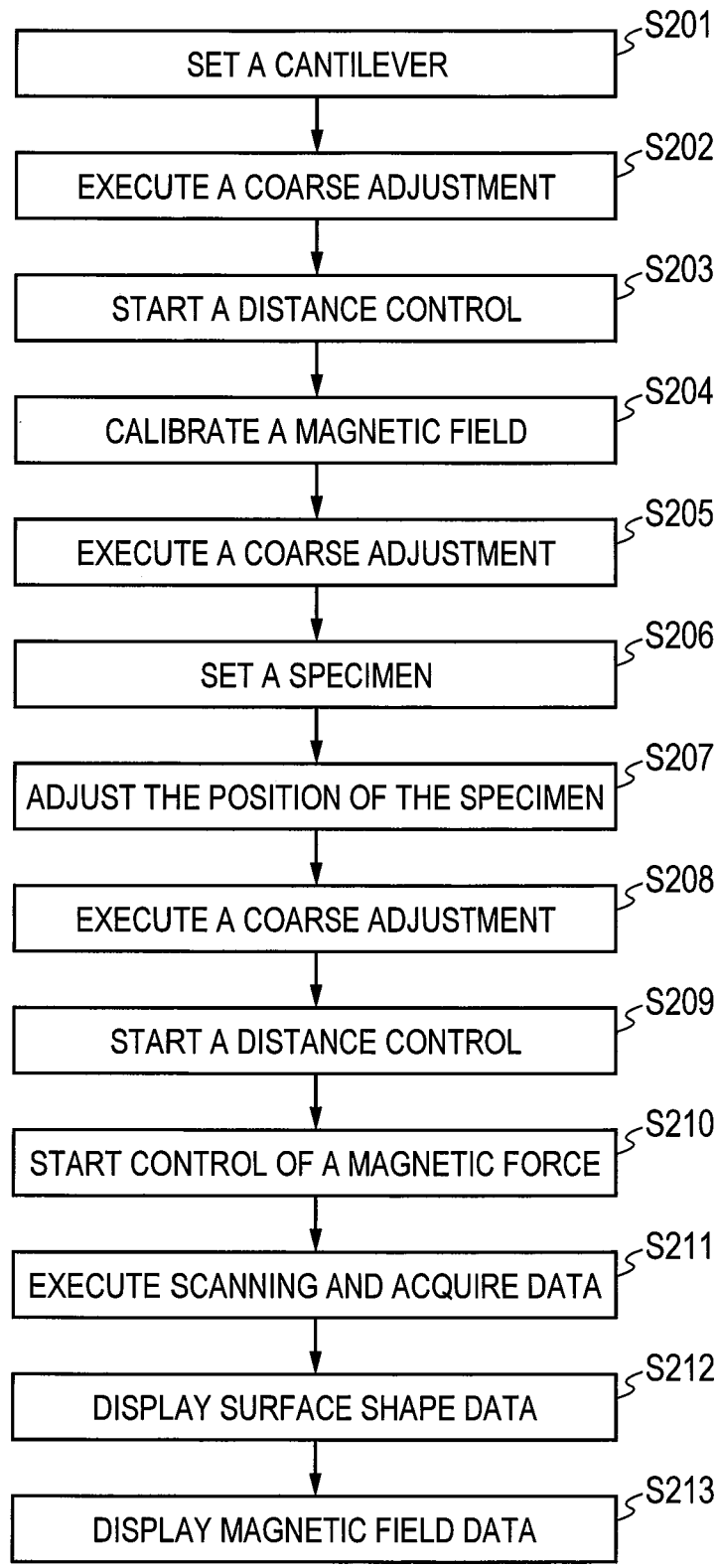
FIG. 2 is a flow chart showing a measurement procedure for the magnetic force microscope (MFM) according to the embodiment of the invention.

In FIG. 2, there is shown a measurement procedure. First, the cantilever 6 is set at the exciter 7 (step S201).

After the cantilever 6 is set, a controller 15 drives a coarse adjustment mechanism 4 via a coarse adjustment unit 17 to thereby execute a coarse adjustment, causing the probe 5 to come close to a position on the order of several hundreds of nanometers away from the specimen carrier 2 (step S202). The coarse adjustment is stopped at a point in time, when the signal outputted from the amplitude detector 9 exceeds a preset threshold value.

Next, in a distance-control start step, control of a distance between the probe and the specimen carrier by use of the first control system 10 is started (step S203).

Next, in a magnetic field calibration step, the controller 15 drives the magnetic-field impress-unit 14 to vary magnetic fields 20, 21, outputted therefrom, and the controller 15 fetches a magnetic field signal from a magnetic-field detector 18 attached to the specimen carrier 2, thereby storing a relationship between an input signal to the magnetic-field impress-unit 14, and the magnetic field signal from the magnetic-field detector 18 (step S204). This step is intended to accurately measure the tip of the probe 5, and the magnetic field 21 in close proximity to the specimen 1.

Further, in a coarse adjustment step, there is executed an operation for separating the probe 5 again so as to be sufficiently away from the specimen carrier 2 (step S205).

In a specimen-setting step, the specimen 1 is set on the specimen carrier 2 (step S206).

Further, in a specimen-position adjustment step, the position of the specimen 1 is adjusted such that a desired position of the specimen 1 to be measured will be directly underneath the probe 5 (step S207).

Next, in a coarse adjustment step, the controller 15 drives the coarse adjustment mechanism 4 via the coarse adjustment unit 17 to thereby execute a coarse adjustment, causing the probe 5 to come close to a position on the order of several hundreds of nanometers away from the specimen 1 (step S208). The coarse adjustment is stopped at the point in time when the signal outputted from the amplitude detector 9 exceeds the preset threshold value.

Next, in a distance-control start step, control of a distance between the probe and the specimen by use of the first control system 10 is started (step S209).

Further, in a magnetic force control start step, control of a magnetic force impressed on the probe 5, by the second control system 13, is started (step S210). At this point in time, the magnetic force is under control such that the distance between the probe 5 and the specimen 1 is at a given value, and the magnetic force impressed on the probe 5 is at zero.

In a scanning and data-acquisition step, the controller 15 drives the XYZ scanning mechanism 3 via a scanning unit 16 to thereby scan the specimen 1 in X-Y directions, in relation to the probe 5 (step S211). Further, the distance between the probe 5 and the specimen 1 is held at the given value.

When the specimen 1 is scanned in the X-Y directions, in relation to the probe 5, the controller 15 fetches an output signal from the first control system 10, at respective points of measurement, as data on a surface shape, further fetching an output signal from the second control system 13, as data on a magnetic field. In a surface-shape data display step, two-dimensional mapping of the data on a surface shape is made by use of respective XY coordinates, and an image of the surface shape is displayed on a display device (not shown) (step S212).

Further, in a magnetic-field data display step, the data on a magnetic field is converted into data on the absolute value of a magnetic field strength by use of the relationship between the input signal to the magnetic-field impress-unit 14, and the magnetic field signal from the magnetic-field detector 18, acquired in the step S204, and two-dimensional mapping of the data on the absolute value is made by use of respective XY coordinates, and an image of a magnetic field distribution is displayed on a display device (not shown) (step S213).

Working Example

The invention is described in detail with reference to a working example described hereunder. It is to be understood that features associated with a working example, identical to features already described under the heading of DETAILED DESCRIPTION OF THE PREFERRED EMBODIMENTS, are applicable to this working example as well.

With the use of a magnetic force microscope according to the working example, a magnetic field distribution on the surface of a magnetic specimen composed of neodymium-iron-boron was measured. The magnetic force microscope has a configuration identical to a configuration shown in FIG. 1. For a neodymium-iron-boron magnet, use was made of ten layers of thin films, 200 nm in thickness, respectively, deposited one after another through the intermediary of a tantalum film 20 nm in thickness, to be formed on an amorphous carbon substrate, the topmost surface of the magnet being covered with a tantalum film 40 nm in thickness. The specimen was demagnetized in a direction perpendicular to a specimen plane. For the cantilever, use was made of a cantilever made of silicon, 110 µm long, and 35 µm wide, having the force constant at 0.95 N/m, and the cantilever was vibrated at 105 kHz as the eigen frequency thereof by a piezoelectric element for excitation, provided at the cantilever. A vibration amplitude of the cantilever was 5 nm. A probe 20 µm long was provided at the tip of the cantilever, and the surface of the probe was coated with cobalt as a ferromagnetic material to a thickness of 60 nm to be further coated with chromium to a thickness of 20 nm to serve as a protective layer.

The displacement of the cantilever was detected by irradiating the surface of the cantilever with a laser beam from a laser diode, and detecting reflected light at that point in time by use of a biplanar photodiode to thereby fetch a differential between two outputs. The detection of the amplitude of the cantilever was made by use of an RMS/DC converter against an AC component of the displacement signal. Further, phase comparison was executed by converting both the excitation signal of the piezoelectric element for excitation, and the displacement signal of the cantilever into respective rectangular waves of a digital signal, and subsequently, carrying out an EXCLUSIVE-OR operation of both the signals before removing a high-frequency component by use of a low-pass filter.

A specimen holder with a Hall device attached thereto was fixedly attached to an XYZ scanning stage using the piezoelectric element, and further, the stage was made up such that the stage in its entirety can be moved in the vertical direction by the coarse adjustment mechanism using a stepping motor, and a screw.

The stage in its entirety was moved in the vertical direction by the coarse adjustment mechanism prior to measurement, and the specimen holder was caused to approach the cantilever disposed so as to be opposed to the specimen holder. After causing the specimen holder to approach the cantilever until a change in the amplitude of the cantilever becomes sufficiently large, the stepping motor was stopped. Further, the XYZ scanning stage was adjusted in the Z-axis direction such that the amplitude of the cantilever was at a preset given value by the agency of a feedback circuit, having thereby held a distance between the probe and the specimen at a given value. With this state being held as it was, a current for energizing a coil provided on the backside of the cantilever was varied, a relationship between a current value and an output voltage of the Hall device was stored in a PC for control, and thereafter, the stage was moved by the coarse adjustment mechanism, having thereby kept the cantilever at a sufficient distance away from the specimen holder. Further, a value of the phase signal, at this point in time, was stored in the PC for control, as a set value of the phase signal corresponding to a point in time, when the magnetic force was at zero.

After fixing the specimen to the specimen holder, the specimen was caused to approach the cantilever by use of the coarse adjustment mechanism until the change in the amplitude of the cantilever becomes sufficiently large, having thereby stopped the stepping motor. Further, a feedback control was carried out such that the amplitude of the cantilever was at the given value, and the distance between the probe and the specimen was held at the given value. Thereafter, a magnetic force feedback circuit was activated, and the value of the current impressed to the coil was controlled such that the phase signal was equal in value to the set value as previously stored. With this state being held as it was, the XYZ scanning stage was driven in the X-Y directions, and a raster scanning with the probe was applied to a region of 10 μm×10 μm, on the surface of the specimen.

Output values of a feedback circuit, for the distance between the probe and the specimen, at respective coordinates, were read into the PC for control by use of a D/A converter to be stored as data on a surface shape. Further, output current values of the magnetic force feedback circuit were read into the PC for control by use of the D/A converter, and values converted by use of a relationship between a coil current as previously stored and a magnetic field, were stored as data on a magnetic field. Mapping of both stored data on a surface shape, and stored data on a magnetic field, with respect to the XY coordinates on the surface of the specimen, were executed, whereupon a surface shape image and a magnetic field distribution image, respectively, were obtained.

With the working example describes as above, the magnetic field of the specimen is offset by the external magnetic field generated by the coil to thereby turn the magnetic field acting on the probe into a zero state at all times, so that stable observation on a magnetic field distribution can be made without changing the magnetization state of the probe. Further, because the strength of the magnetic field of the specimen is identical to the strength of the external magnetic field at all times, the absolute value of magnitude of the magnetic field of the specimen can be measured from the magnitude of the external magnetic field that is impressed.

The invention is applicable to evaluation on both the size and structure of a magnetic domain of a magnet material, and evaluation on a magnetic field around a hard disk drive.

What is claimed is:

1. A magnetic force microscope provided with a unit that measures an undulation distribution as well as a magnetic field distribution on the surface of a magnetic specimen, the magnetic force microscope comprising:
    a cantilever;
    a probe provided at the tip of the cantilever, at least part of the probe being provided with a magnetized material;
    a displacement detector that detects a displacement of the cantilever;
    a magnetic-field impress-unit that impresses a magnetic field onto the probe;
    a magnetic field control unit that controls the magnetic field generated by the magnetic-field impress-unit such that a magnetic force impressed onto the probe by the magnetic-field impress-unit is turned zero; and
    a distance-hold unit that holds a distance between the probe and the specimen to such an extent that the probe does not come into contact with the specimen while controlling the displacement of the cantilever on the basis of a signal sent out from the displacement detector,
    wherein a magnetic field distribution on the surface of the specimen is acquired while holding the distance between the probe and the specimen to such an extent that the probe does not come into contact with the specimen in a state where the magnetic force impressed onto the probe is turned zero,
    wherein the magnetic field control unit includes an exciter that causes vibration of the cantilever, and a phase comparator that compares the phase of a signal from the displacement detector with the phase of a signal of the exciter, and
    wherein the magnetic field control unit controls the magnetic-field impress-unit on the basis of an output from the phase comparator such that a change in the phase of the cantilever is turned zero.

2. The magnetic force microscope according to claim 1, wherein the distance-hold unit includes an amplitude detector that detects an amplitude of a signal identical in frequency component to a signal of the exciter from a signal of the displacement detector, the distance-hold unit controlling such that a distance between the probe and the surface of the specimen is kept at a given value on the basis of an output signal from the amplitude detector.

3. The magnetic force microscope according to claim 1, further comprising:
    a specimen carrier that places the specimen thereon; and
    a transfer unit that transfers the specimen carrier,
        wherein the magnetic field from the magnetic-field impress-unit, at a position of the probe having approached over the specimen, is measured by use of a magnetic-field detector while varying an input signal to the magnetic-field impress-unit to thereby acquire a relationship between an input signal to the magnetic-field impress-unit and an output signal of the magnetic-field detector, and a storage unit that stores the relationship as acquired is provided.

4. A magnetic force microscope that measures a magnetic field distribution on the surface of a specimen by use of a ferromagnetic probe, the magnetic force microscope comprising:
    a relative transfer unit that transfers the ferromagnetic probe in the in-plane directions as well as a vertical direction against the surface of the specimen;

an exciter that causes vibration of the probe;

a displacement detector that detects a displacement of a cantilever;

a magnetic-field impress-unit that impresses a magnetic field onto the probe;

a magnetic-field detector that detects a magnetic-field from the magnetic-field impress-unit;

a storage unit that stores a relationship between an input signal to the magnetic-field impress-unit and an output signal of the magnetic-field detector;

an amplitude detector that detects an amplitude of a frequency component of a signal of the exciter from an output signal of the displacement detector;

a first control system that controls the relative transfer unit in the vertical direction such that an output from the amplitude detector is at a given value;

a phase comparator that compares the phase of the output signal of the displacement detector with the phase of an excitation signal of the exciter;

a second control system that controls the magnetic-field impress-unit such that an output of the phase comparator is at a given value;

a converter that converts an output of the second control system into a magnetic field signal by making use of the relationship between the input signal to the magnetic-field impress-unit and the output signal of the magnetic-field detector, stored in the storage unit;

a controller that acquires an output of the first control system, and an output of the converter while transferring the relative transfer unit in the in-plane directions, and a display device that displays the output of the first control system, and the output of the converter, acquired in the controller, respectively, in such a way as to correspond to respective positions in the in-plane directions of the relative transfer unit.

5. A magnetic field observation method using a magnetic force microscope provided with a unit that measures an undulation distribution as well as a magnetic field distribution on the surface of a magnetic specimen, the magnetic force microscope further including a cantilever, a probe provided at the tip of the cantilever, at least part of the probe including a magnetized material, a displacement detector that detects a displacement of the cantilever, a magnetic-field impress-unit that impresses a magnetic field onto the probe, a specimen carrier that places the specimen thereon, and a transfer unit that transfers the specimen carrier, the magnetic field observation method comprising:

controlling the magnetic field generated from the magnetic-field impress-unit such that a magnetic force impressed onto the probe by the magnetic-field impress-unit is turned zero;

holding the probe a distance away from the specimen to such an extent that the probe does not come into contact with the specimen while controlling the displacement of the cantilever on the basis of a signal sent out from the displacement detector;

holding the probe the distance away from the specimen to such an extent that the probe does not come into contact with the specimen while keeping a state where the magnetic force impressed on the probe is turned zero;

acquiring the magnetic field distribution on the surface of the specimen while holding the probe the distance away from the specimen to such an extent that the probe does not come into contact with the specimen, in a state where the magnetic force impressed on the probe is turned zero;

measuring a magnetic field from the magnetic-field impress-unit, at a position of the probe having approached over the specimen, by use of a magnetic-field detector, while varying an input signal to the magnetic-field impress-unit;

acquiring and storing a relationship between the input signal to the magnetic-field impress-unit and an output signal of the magnetic-field detector, on the basis of a result of the measurement;

scanning the specimen in X-Y directions, in relation to the probe, by use of the transfer unit;

fetching data on a surface shape of the specimen, at respective scanned points of measurement;

fetching data on a magnetic field at the respective scanned points of measurement;

executing two-dimensional mapping of the data on the surface shape, as fetched, by use of respective X-Y coordinates, and displaying an image of the surface shape; and converting the data on a magnetic field, as fetched, into data on the absolute values of a magnetic field strength by making use of the relationship between the input signal to the magnetic-field impress-unit and the output signal of the magnetic-field detector;

executing two-dimensional mapping of the data on the absolute values of the magnetic field strength, by use of respective XY coordinates, and displaying an image of the magnetic field distribution.

* * * * *